(12) United States Patent
Wang et al.

(10) Patent No.: US 9,165,880 B2
(45) Date of Patent: Oct. 20, 2015

(54) PROCESS CONTROL METHODS FOR CMP (CHEMICAL MECHANICAL POLISHING) AND OTHER POLISHING METHODS USED TO FORM SEMICONDUCTOR DEVICES

(75) Inventors: Po-Jen Wang, Taichung (TW);
Hsiang-Hui Tsai, Tainan (TW);
Ying-Chen Chiu, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 890 days.

(21) Appl. No.: 13/420,194

(22) Filed: Mar. 14, 2012

(65) Prior Publication Data

US 2013/0244544 A1    Sep. 19, 2013

(51) Int. Cl.
*H01L 23/522* (2006.01)
*H01L 21/768* (2006.01)
*H01L 21/66* (2006.01)

(52) U.S. Cl.
CPC ........ *H01L 23/5223* (2013.01); *H01L 21/7684* (2013.01); *H01L 21/76808* (2013.01); *H01L 21/76819* (2013.01); *H01L 22/20* (2013.01); *H01L 22/12* (2013.01)

(58) Field of Classification Search
CPC ............ H01L 23/5223; H01L 21/7684; H01L 21/76808; H01L 21/76819; H01L 22/20; H01L 22/12
See application file for complete search history.

(56) References Cited

U.S. PATENT DOCUMENTS

2013/0244544 A1 *   9/2013   Wang et al. ............... 451/41

* cited by examiner

*Primary Examiner* — Jack Chen
(74) *Attorney, Agent, or Firm* — Duane Morris LLP (57) ABSTRACT

A method for controlling device feature sizes produced by polishing operations such as chemical mechanical polishing (CMP) is provided. The method includes instituting process controls to control the processing operations used in combination to produce features of a metal layer with a desired thickness, based on the thickness of the previous metal layer or layers. A target thickness for first and second metal layers is established. After the first metal layer is produced and the difference between the first metal target thickness and the actual first metal thickness is determined, the target thickness for the second metal features is adjusted. Once the target thickness for the second metal features is adjusted, each of the processing operations used to produce the second metal layer is controlled in combination to produce the second metal features with the adjusted target thickness.

20 Claims, 6 Drawing Sheets

PROCESS CONTROL METHODS FOR CMP (CHEMICAL MECHANICAL POLISHING) AND OTHER POLISHING METHODS USED TO FORM SEMICONDUCTOR DEVICES

TECHNICAL FIELD

The disclosure is related, most generally, to semiconductor device manufacturing and more particularly to process control techniques used in polishing and related operations, based upon measured device parameters.

BACKGROUND

In today's rapidly advancing semiconductor manufacturing industry, devices are being formed to include smaller device features and using more precise alignment tolerances. It is necessary to produce device features having desired sizes in all three dimensions. In order to produce device features having the desired and correct three dimensional size, it is necessary to control the thickness of the device features accurately. While this is true for all semiconductor device features, particular structures such as stacked MOM (metal oxide metal) capacitors and stacked RTMOM (rotated metal oxide metal) capacitors, are particularly sensitive to the thicknesses of the conductive layers used to form the stacked capacitors. While it is important to control the respective thicknesses of each of the individual metal layers used to form the MOM capacitors, it is equally important to control the aggregate thickness of the stacked layers used to form the MOM capacitors.

Methods are needed to control such parameters.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

Figure 1:
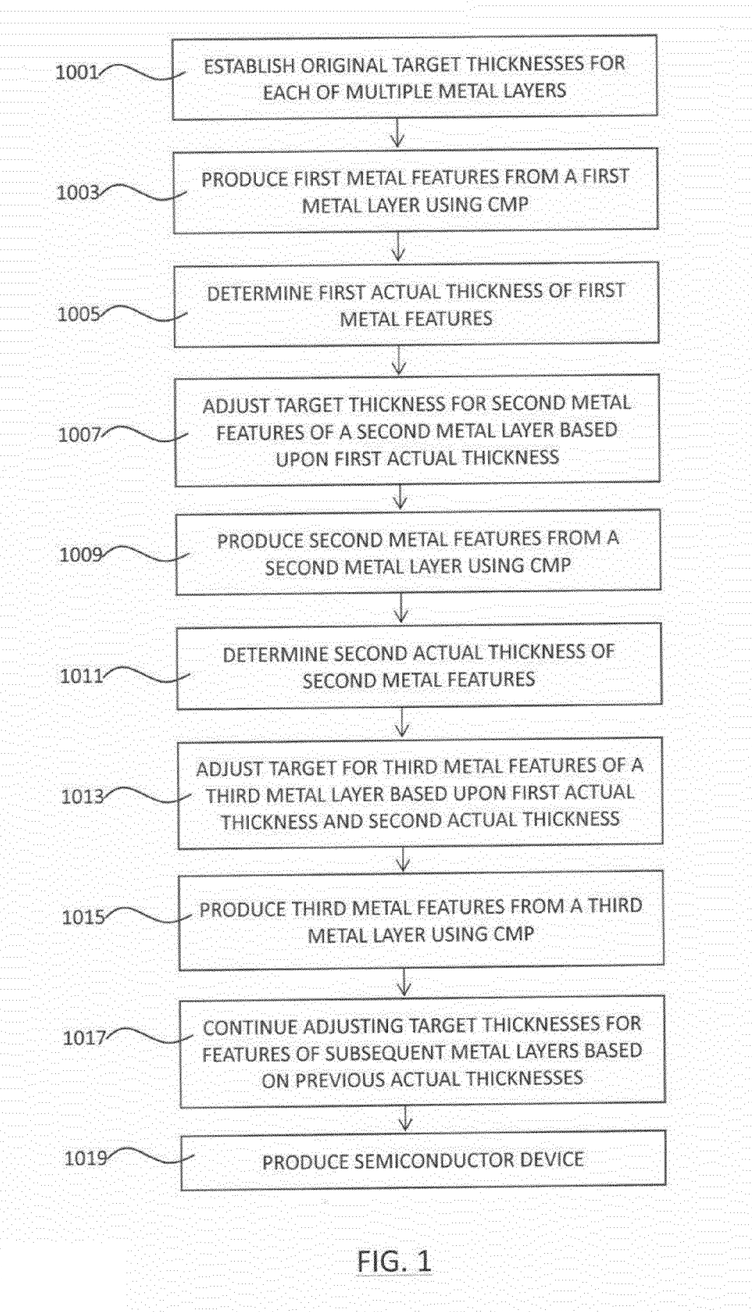
FIG. 1 is a flowchart of an embodiment of a method of the disclosure.

FIG. 1 is a flowchart that illustrates aspects of an embodiment of the disclosure which is used to form any of various semiconductor devices. The semiconductor device is an MOM capacitor in one embodiment. In one embodiment, the MOM capacitor includes multiple digits formed in a metal level, spaced apart from each other by a dielectric and serving as electrode plates. Multiple stacked metal layers having multiple digits combine to form a stacked MOM capacitor, in one embodiment. In one particular embodiment, the semiconductor device is an RTMOM (rotated MOM) capacitor such that the parallel electrode plates of one device level are rotated with respect to the parallel electrode plates of the vertically adjacent device level. In other embodiments, other semiconductor devices are formed. In various embodiments, the semiconductor devices being formed include multiple metal layers that are disposed over one another and may be interconnected using vias or other suitable trench techniques. In other embodiments, other types of semiconductor devices are formed and the controls may be applied to polishing operations that polish materials other than metals.

The flowchart of FIG. 1 is directed to the embodiment in which metal layers are polished but it should be understood that the principles of the disclosure are applied to the polishing and production of other materials in other embodiments. Step 1001 provides for establishing original target thicknesses for each of the multiple metal layers. Step 1003 provides for producing first metal features from a first metal layer using CMP, chemical mechanical polishing. In other embodiments, other polishing methods are used. In various embodiments, one or more dielectric layers are formed, openings are formed in the dielectric layer, a first metal layer is formed over the dielectric and filling the openings and then CMP is used to remove the first metal layer from over the dielectric, thereby forming first metal features in the openings according to damascene methods. Step 1005 provides for determining first actual thickness of the first metal features. Various measurement techniques are used in various embodiments. The first actual thickness is compared to the original target thickness for the first metal layer.

Step 1007 provides for adjusting the target thickness for second metal features of a second metal layer based upon the first actual thickness. More particularly, the adjusted target thickness for the second metal features of the second metal layer is based upon the difference between the first actual thickness and the original target thickness for the first metal layer. If the first actual thickness is less than the first target thickness, the adjusted target thickness for the second metal features will represent the original target thickness of the second metal layer increased by the difference between the first actual thickness and the first target thickness, in one embodiment. Conversely, if the first actual thickness is greater than the first target thickness, the adjusted target thickness for the second metal features will represent the original target thickness of the second metal layer decreased by the difference between the first actual thickness and the first target thickness, in one embodiment. Step 1009 provides for producing second metal features from a second metal layer using CMP. The processing operations used to form the second metal features are directed to producing the adjusted target thickness for the second metal features. More particularly, the processing parameters are controlled to combine to produce second metal features having the adjusted target thickness. The processing operations include at least deposition of a second dielectric layer, an etching operation, and a polishing operation. Additional operations such as the formation of an etch stop layer, are used in some embodiments. In various embodiments, the target thickness of the second dielectric layer is determined based upon the adjusted target thickness for the second metal features. An etching operation is used to etch down into the second dielectric to a desired trench depth and the desired trench depth is also determined based upon the adjusted target thickness for the second metal features in various embodiments. After the second metal layer is formed over the second dielectric and filling the openings in the second dielectric, a polishing operation is used to remove the second metal layer from over the second dielectric, leaving portions of the second metal layer, referred to as second metal features, within the trench openings. In some embodiments, the polishing operation includes overpolishing to recede the second dielectric surface. The amount of overpolishing that recedes the second dielectric to produce the second metal features is also determined based upon the adjusted target thickness and directed to producing second metal features having the adjusted target thickness.

In various embodiments, the combination of the processing operations are collectively adjusted to produce the adjusted target thickness for the second metal features. In particular, the parameters of the processing operations are controlled to produce a target thickness of the second dielectric, a desired depth of the trench openings etched into the second dielectric and a desired amount of any overpolishing. These parameters are collectively directed to producing the adjusted target thickness for the second metal features which can differ from the original target thickness for the second metal features.

Step 1011 provides for determining second actual thickness of the second metal features. Various measurement techniques are used in various embodiments. The second actual thickness is compared to the adjusted target thickness for the second metal layer. Step 1013 provides for adjusting the target thickness for third metal features of a third metal layer based on first actual thickness and second actual thickness. More particularly, the adjusted target thickness for the third metal features is determined based upon a) the difference between the first actual metal thickness and the first target thickness and also b) the difference between the second actual thickness and the adjusted target thickness for the second metal features. Step 1015 provides for producing third metal features from a third metal layer using CMP or other polishing techniques. The processing operating used to form a third metal features are collectively directed and controlled to produce the adjusted target thickness for the third metal features. More particularly, the processing parameters are controlled in the aggregate to produce third metal features having the adjusted target thickness in a manner such as described for producing second metal features in conjunction with Step 1009.

Figure 2:
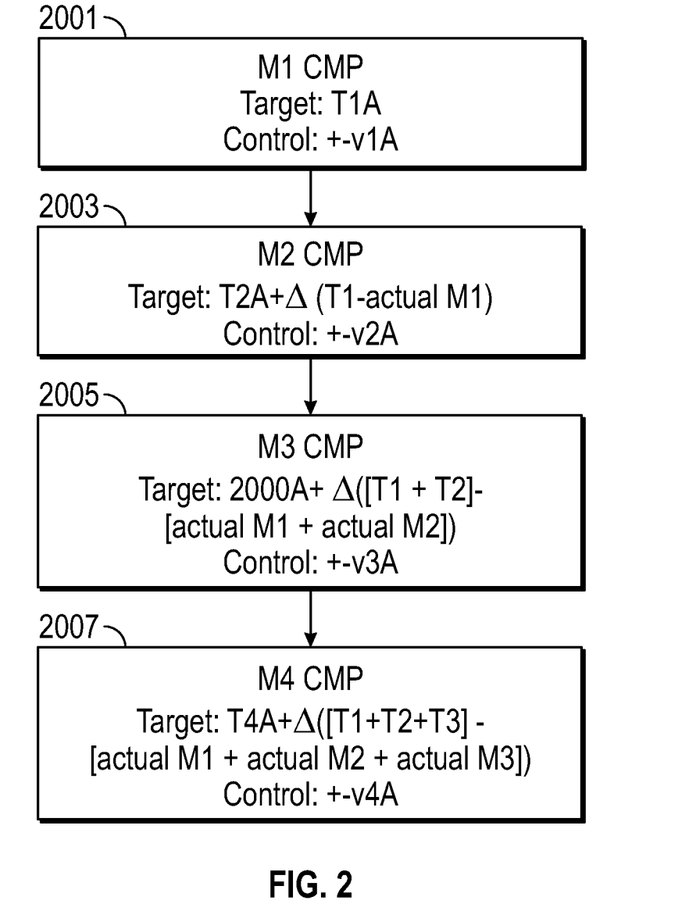
FIG. 2 is a flowchart illustrating a sequence of process steps that numerically illustrates an embodiment of the disclosure.

Step 1017 provides for continuing the sequence of adjusting target thicknesses for features of subsequent metal layers based on previous actual thicknesses. More particularly, the aggregate differences between the previous actual thicknesses and the corresponding original thicknesses such as described above, are used to derive the adjusted target thickness for a subsequent metal layer, such as illustrated in FIG. 2. Step 1019 provides for carrying out subsequent processing operations to produce the semiconductor device.

FIG. 2 is a schematic-type flowchart that mathematically illustrates one embodiment of the execution of the process control aspects of disclosure. Step 2001 provides that the metal 1 layer produced by chemical mechanical polishing (CMP) has a target thickness of T1 angstroms. The target thickness for the metal 2 layer produced by CMP is originally set at T2 angstroms (step 2003). This represents the target thickness desired for metal 2 features produced by CMP polishing of the metal 2 layer. Step 2003 shows that the adjusted target thickness for metal 2 produced by CMP is T2 angstroms (the original target thickness for metal 2) plus the difference between T1 angstroms and the actual metal 1 thickness. T1 angstroms represents the original target thickness of the metal 1 layer. Step 2005 shows that for a metal 3 layer produced by CMP and having an original target thickness of T3 angstroms, the adjusted metal 3 feature target thickness is T3 angstroms plus the difference between [T1+T2] angstroms and the aggregate of the actual metal 1 and metal 2 feature thicknesses. [T1+T2] angstroms represents the aggregate original target thicknesses of the previously formed metal layers. Step 2007 shows a subsequent metal formation operation. A fourth metal layer, metal 4, is produced by CMP and has an original target thickness of T4 angstroms. The adjusted target thickness for the metal 4 features produced by CMP, is now 14 angstroms plus the difference between [T1+T2+T3] angstroms and the actual aggregate thickness of metal 1, metal 2 and metal 3 after polishing. [T1+T2+T3] angstroms represents the aggregate original target thicknesses of the previously formed metal layers. The parameters of each of the processing operations that combine to produce the metal 4 features are then set, i.e. controlled to produce the desired target thickness for metal 4. The same principles apply to the formation of the previous levels.

It should be understood that various numerical values are used for the original target thicknesses T1, T2, T3, T4 shown in FIG. 2 which are used to illustrate mathematical process control techniques of the disclosure. In other embodiments, the disclosure is used to form features at various levels that have a variety of original target thicknesses.

FIGS. 3A-3I illustrate a sequence of processing operations that illustrate an embodiment of the disclosure. It should be understood that FIGS. 3A-3I illustrate one embodiment in which a second metal layer is formed over a first metal layer according to aspects of the disclosure such as discussed in conjunction with FIGS. 1 and 2. It should be further understood that the disclosure further provides for following the process control principles discussed in conjunction with FIGS. 3A-3I for the processing of subsequently formed metallization layers that are not illustrated.

It should be further understood that while FIGS. 3A-3I are described in terms of metallization layers as were the previous flowcharts of FIGS. 1 and 2, the principles of the disclosure can also be used for the process control techniques used for forming layers of different type materials such as semiconductor materials like polysilicon or other non-metal materials.

Figure 3A:
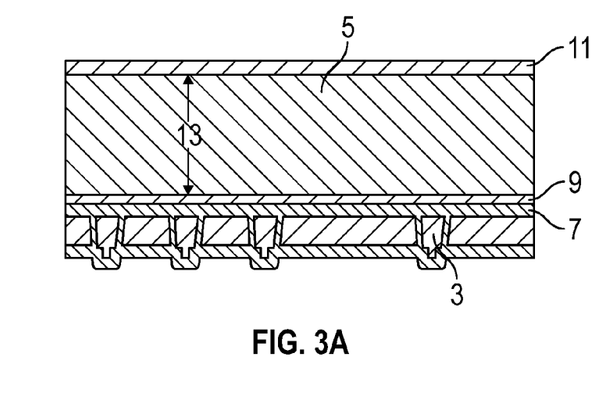
FIGS. 3A-3I are cross-sectional views showing a sequence of processing operations illustrating an embodiment of the disclosure.

FIG. 3A shows first metal leads 3 formed of a first metal layer and extending in and out of the plane of the drawing sheet. Dielectric layer 5 is disposed over first metal leads 3. More particularly, dielectric 5 is disposed over etch stop layer 7 and buffer layer 9. Antireflective coating 11 is formed over dielectric 5. Dielectric 5 may be one or multiple separately formed layers of dielectric material and may include various thicknesses. First metal leads 3, etch stop layer 7, buffer layer 9, dielectric 5 and antireflective coating 11 are formed of various suitable materials available in the art. First metal leads 3 are formed of copper in one embodiment. In other embodiments, first metal leads 3 are formed of aluminum or aluminum or copper alloys or other suitable conductive materials. While antireflective coating 11, buffer layer 9 and etch stop layer 7 appear in the illustrated embodiment, in other embodiments, these layers may be altered or not used. As discussed previously, the actual thickness of first metal leads 3 is compared to an original target thickness for metal leads 3 and the difference between these values is determined. The difference between the actual thickness of first metal leads 3 and the original target thickness for metal leads 3 is used to produce an adjusted second metal target thickness for features that will be subsequently formed in a second metal layer, according to the process control principles discussed previously. In one embodiment, the difference between the actual thickness of first metal leads 3 and the original target thickness for metal leads 3 is used to determine the desired value for thickness 13 of dielectric 5. In other embodiments, the desired value for thickness 13 of dielectric 5 may be according to original specifications.

Figure 3B:
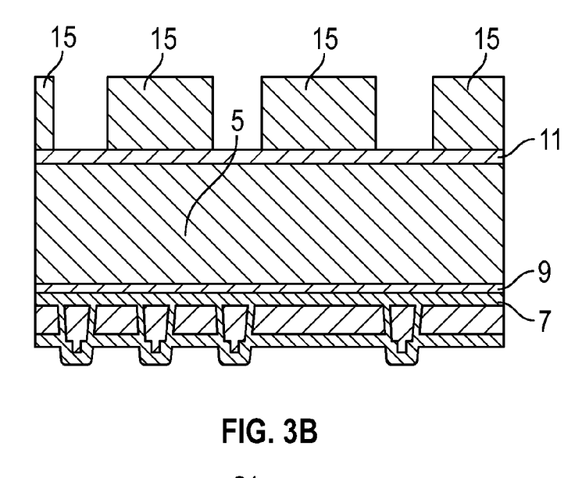
Figure 3C:
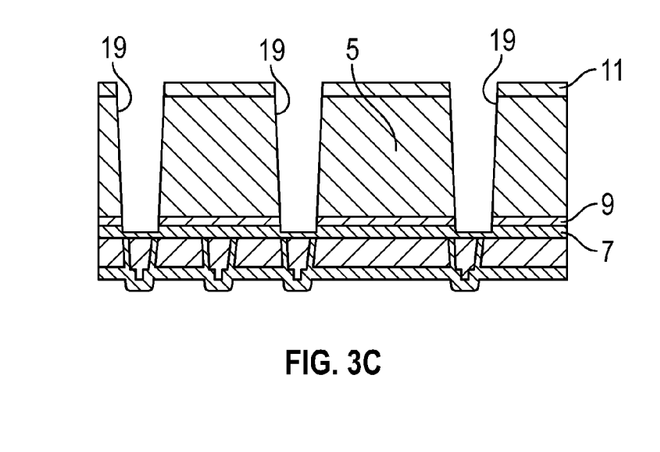

FIG. 3B shows the structure of FIG. 3A after patterned photoresist 15 is formed over the structure for use as a photomask. FIG. 3C shows the structure of FIG. 3B after openings 19 are formed through antireflective coating 11, dielectric 5 and buffer layer 9, terminating on etch stop layer 7, and after the photomask, i.e. patterned photoresist 15, has been removed. Various etching and stripping methods are used in various embodiments.

Figure 3D:
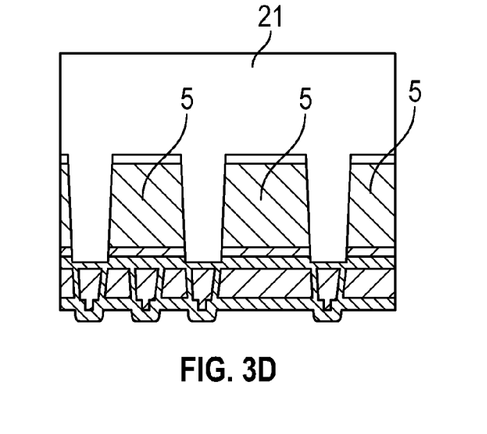

FIG. 3D shows the structure of FIG. 3C after photoresist 21 has been formed over dielectric 5 and plugging previous openings 19 shown in FIG. 3C.

Figure 3E:
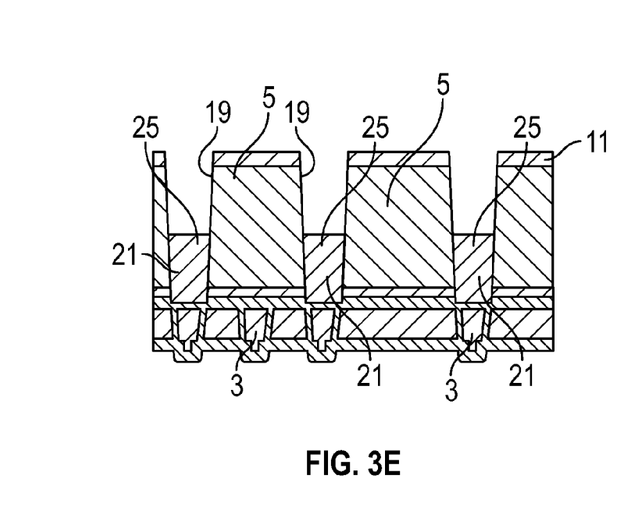
Figure 3F:
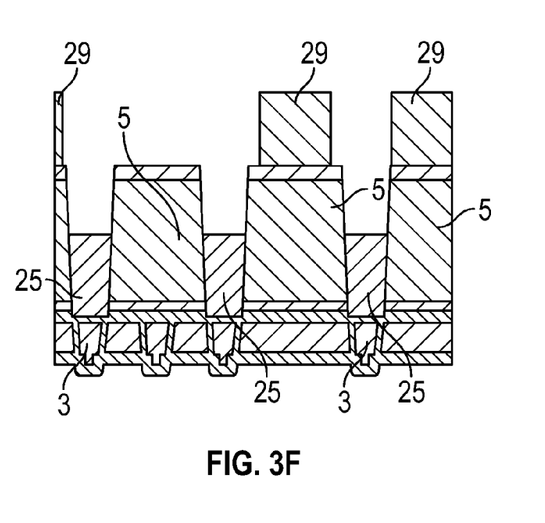

FIG. 3E shows the structure of FIG. 3D after a photoresist etch back operation is used to recede photoresist 21 to produce photoresist plugs 25 of photoresist 21 within now partially-filled openings 19. FIG. 3F shows the structure of FIG. 3E after a further metal photoresist pattern 29 is formed. In one embodiment, different photoresist types are used so that the development of photoresist pattern 29 does not remove photoresist plugs 25. In another embodiment, other precautions such as a plasma treatment are taken to insure that photoresist plugs 25 remain substantially intact after metal photoresist pattern 29 is formed.

Figure 3G:
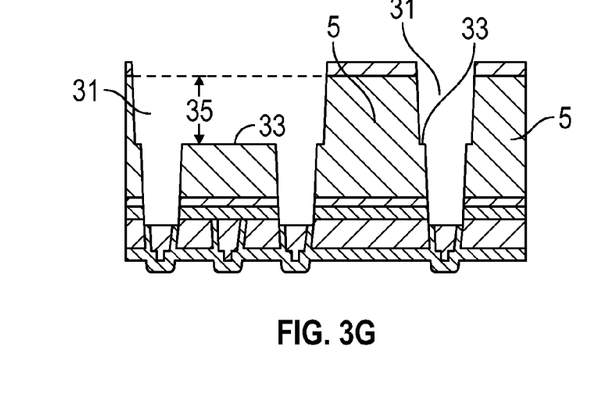

Using metal photoresist pattern 29 as a photomask, an etching operation is carried out and followed by a photoresist removal operation, to produce the structure in FIG. 3G which includes openings 31 having bottom surfaces 33. Subsequent operations will be used to fill openings 31 with a second metal layer. The etching operation does not etch completely through dielectric 5. The degree of etching, i.e., the depth 35 of the etch operation and the position of bottom surface 33 is determined based upon the adjusted thickness of second metal features as described above. The targeted value for depth 35 is chosen and controlled so that features of a second metal layer can be formed to have the adjusted second metal target thickness after polishing.

Figure 3H:
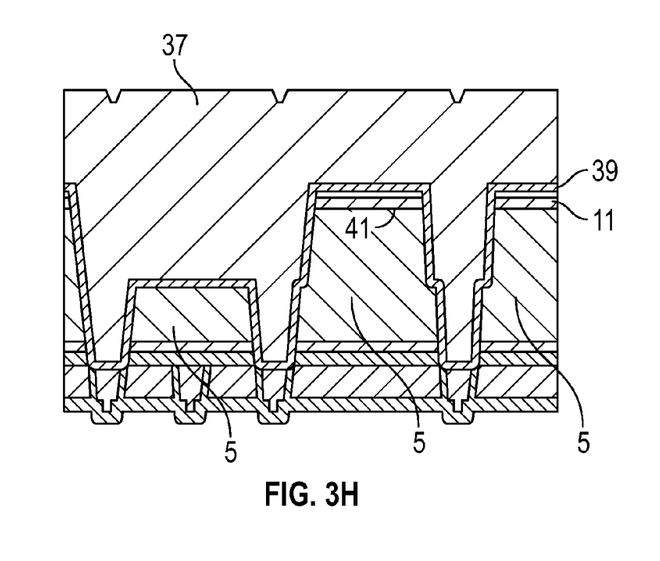

FIG. 3H shows the structure of FIG. 3G after a second metal seed layer 39 has been formed and after second metal layer 37 has been formed over top surface 41 of dielectric 5. Second metal seed layer 39 and second metal layer 37 also fill openings 31 previously shown in FIG. 3G.

Figure 3I:
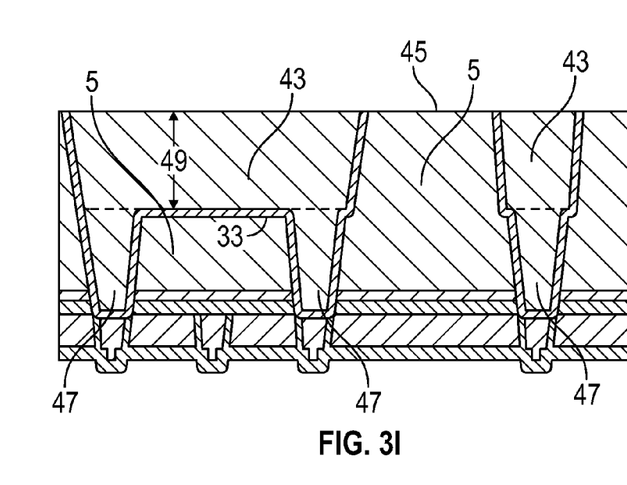

FIG. 3I shows the structure of FIG. 3H after a polishing operation has been carried out. The polishing operation is chemical mechanical polishing (CMP) in one embodiment. In another embodiment, another polishing operation is used. In one embodiment, the CMP or other polishing operation terminates at upper surface 41 of dielectric layer 5 or at an etch stop layer (not shown) that may be formed over dielectric layer 5. According to another embodiment, the original upper surface 41 of dielectric 5 is receded by overpolishing that takes place in the polishing operation, to produce receded surface 45. Receded surface 45 and bottom surface 33 determine the actual thickness 49 of second metal features 43. Vias 47 are formed in the lower portions of previous openings 31, and are distinguished from second metal features 43 as indicated by the dotted line.

Once the difference between the actual thickness of first metal leads 3 and the target thickness for these features is established, the target thickness for second metal features may be calculated. The target thickness for the second metal features may be an adjusted second metal target thickness as discussed previously. Once the second metal target thickness is established, the processing parameters of either or all of the following, previously described, processing operations are controlled in conjunction with one another to produce the adjusted second metal target thickness. The deposition operation or operations used to form dielectric 5 may be controlled to produce a desired thickness. The amount of etching carried out in FIG. 3G to produce openings 31 to a desired depth may be controlled. The degree of any overpolishing that takes place upon the structure shown in FIG. 3H to recede the dielectric top surface and produce the structure shown in FIG. 3I, may be controlled.

In one embodiment, first metal leads 3 represent parallel or other electrodes of a first level of a MOM capacitor and second metal features 43 form parallel or other electrodes in a second level of the MOM capacitor. According to this embodiment, first metal leads 3 are coupled to second metal features 43 by vias 47 as appropriate. First metal leads 3 are rotated with respect to second metal features 43 by 90 degrees or other amounts, in some embodiments. Other structures are formed in other embodiments.

Figure 4:
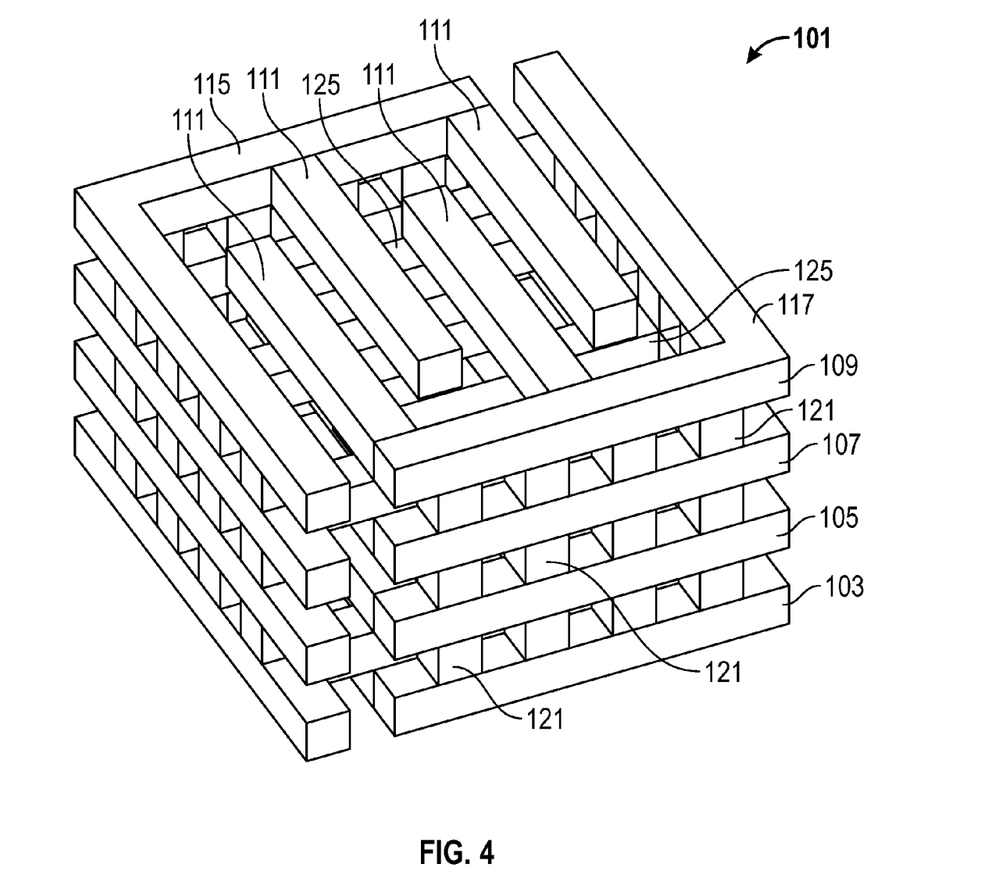
FIG. 4 is a perspective view showing an exemplary RTMOM (rotated MOM) capacitor formed according to the disclosure.

FIG. 4 is a perspective view of an exemplary structure formed according to principles of the disclosure. FIG. 4 illustrates a rotated stacked MOM capacitor. Rotated MOM capacitor 101 consists of four stacked metal layers in the illustrated embodiment: first metal layer 103, second metal layer 105, third metal layer 107 and fourth metal layer 109. Each metal layer includes parallel metal leads such as metal leads 111 shown for fourth metal layer 109. Metal leads 111 are parallel to one another with alternate metal leads coupled to opposite electrodes 115 and 117 for fourth metal layer 109 in the illustrated embodiment. Metal leads 111 may also be referred to as metal fingers. Parallel metal leads 125 of third metal layer 107 also form a layer of the MOM capacitor and alternate parallel metal leads 125 are coupled to opposite electrodes. Parallel metal leads 125 of third metal layer 107 are rotated by 90 degrees with respect to parallel metal leads 111 of fourth metal layer 109. In one embodiment, the parallel metal leads of each successive metal layer are rotated 90 degrees with respect to the vertically adjacent metal layer to produce a rotated MOM capacitor. The different stacked metal layers are coupled to one another by vias 121 to form MOM capacitor 101. One aspect of the disclosure is that the aggregate thickness of the four metal layers 103, 105, 107 and 109 is controlled according to described principles such that MOM capacitor 101 has a desired aggregate thickness. In particular, when one metal layer such as fourth metal layer 109 is being formed, it will be formed to have a target thickness based on the difference between the total aggregate thicknesses of first, second and third metal layers 103, 105 and 107 and the aggregate target thickness for these levels.

One aspect of the disclosure is a method for forming a semiconductor device. The method comprises: establishing a first metal target thickness for first metal features and an original second metal target thickness for second metal features; producing a first metal layer with the first metal features having a first metal thickness; and establishing an adjusted second metal target thickness that differs from the original second metal target thickness, based upon a difference between the first metal thickness and the first metal target thickness.

According to another aspect, a method for forming at least an MOM (metal oxide metal) capacitor is provided. The method comprises: forming a dielectric with an upper surface and having openings extending downwardly from the upper surface; forming a first metal layer over the dielectric and filling the openings, then polishing to planarize and remove portions of the first metal layer from over the upper surface to produce first metal features in the openings. The method also provides for determining a thickness of the first metal features; forming a further dielectric by depositing at least one subsequent dielectric layer to a predetermined aggregate thickness over the dielectric and over the first metal features; etching portions of the further dielectric to a predetermined depth thereby creating further openings having bottom surfaces in the further dielectric, at least one of the predetermined aggregate thickness the depth determined based upon the thickness of the first metal features; forming a second metal layer over the further dielectric and filling the further openings; and further polishing to produce second metal features of the second metal layer.

A further method for forming a semiconductor device is also provided. The method comprises: establishing a first metal target thickness for first metal features and an original second metal target thickness for second metal features; producing a first metal layer with the first metal features having an actual first metal thickness; and establishing an adjusted second metal target thickness, the adjusted second metal target thickness differing from the original second metal target thickness by the difference between the actual first metal thickness and the first metal target thickness. The method further provides for forming a dielectric over the first metal features, the dielectric having a dielectric thickness; etching portions of the dielectric to a depth thereby creating openings having bottom surfaces in the dielectric; forming a second metal layer over the dielectric and filling the openings; and polishing to at least remove portions of the second metal layer from over the dielectric and producing the second metal features in the openings. The method provides for controlling the processing parameters for forming a dielectric, etching, and polishing to produce a target dielectric thickness, a target depth and a target amount of polishing that combine to produce the second metal features having the adjusted second metal target thickness.

The preceding merely illustrates the principles of the disclosure. It will thus be appreciated that one of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by one of ordinary skill in the art without departing from the scope and range of equivalents of the disclosure.

What is claimed is:

1. A method for forming a semiconductor device, said method comprising:
    establishing a first metal target thickness for first metal features and an original second metal target thickness for second metal features;
    producing a first metal layer with said first metal features having a first metal thickness; and
    establishing an adjusted second metal target thickness that differs from said original second metal target thickness, based upon a difference between said first metal thickness and said first metal target thickness.

2. The method as in claim 1, further comprising forming a second metal layer with said second metal features over said first metal layer.

3. The method as in claim 2, wherein said first metal features are leads disposed within first openings formed in a first dielectric layer.

4. The method as in claim 3, wherein said forming a second metal layer with second metal features includes forming a second dielectric layer, etching second openings that terminate in said second dielectric layer, depositing said second metal layer over said second dielectric and filling second openings, and polishing to at least remove said second metal layer from over said second dielectric layer.

5. The method as in claim 4, wherein said adjusted second metal target thickness is used to establish at least an amount of said etching and a degree of said polishing.

6. The method as in claim 5, wherein said polishing further comprises receding an upper surface of said second dielectric by an amount determined by said second metal target thickness, and wherein said first metal layer and said second metal layer comprise copper.

7. The method as in claim 4, further comprising forming vias between said first metal features and said second metal features.

8. The method as in claim 1, wherein said semiconductor device comprises a stacked MOM (metal oxide metal) capacitor, wherein said first metal features form a lower level of said MOM capacitor and said second metal features form an upper level of said MOM capacitor.

9. The method as in claim 8, wherein said first metal features form first parallel fingers of said lower level of said MOM capacitor, said second metal features form second parallel fingers of said upper level of said MOM capacitor and said first parallel fingers are orthogonal to said second parallel fingers.

10. The method as in claim 1, wherein said producing a first metal layer with said first metal features comprises forming said first metal layer over a dielectric and filling first openings in said dielectric, then polishing to planarize and remove portions of said first metal layer from over said dielectric, and further comprising:
    forming a second dielectric over said dielectric and over said first metal features;
    etching second openings in said second dielectric;
    forming a second metal layer over said second dielectric and filling said second openings; and
    second polishing to produce said second metal features within said second openings, wherein at least one of a target thickness of said second dielectric, an amount of said etching and a degree of said second polishing is established to produce said adjusted second metal target thickness.

11. The method as in claim 10, wherein said second openings include bottom surfaces within said second dielectric.

12. The method as in claim 10, further comprising forming a third metal layer with third metal features over said second dielectric and over said second metal features by forming a third dielectric, etching third openings in said third dielectric, depositing said third metal layer over said third dielectric and filling said third openings, and third polishing to remove portions of said third metal layer from over said third dielectric, wherein parameters for at least one of said forming a third dielectric, said etching third openings and said third polishing are determined by an adjusted third metal target thickness, and wherein said adjusted third metal target thickness differs from an original third metal target thickness and is calculated based upon a first difference between said first metal thickness and said first metal target thickness and a second difference between a second metal thickness of said second metal features and said adjusted second metal target thickness.

13. The method as in claim 12, wherein said semiconductor device comprises a stacked MOM (metal oxide metal) capacitor, said first metal features forming a lower layer of said MOM capacitor, said second metal features forming an intermediate layer of said MOM capacitor and third metal features of said third metal layer forming an upper layer of said MOM capacitor.

14. The method as in claim 12, further comprising forming lower vias between said first metal features and said second metal features and upper vias between said second metal features and said third metal features and wherein each of said first metal features, said second metal features and said third metal features include parallel electrodes.

15. The method as in claim 1, wherein said producing a first metal layer comprises forming a dielectric with an upper surface and having openings extending downwardly from said upper surface, forming said first metal layer over said dielectric and filling said openings, then using chemical mechanical polishing (CMP) to planarize and remove portions of said first metal layer from over said upper surface.

16. A method for forming at least an MOM (metal oxide metal) capacitor, said method comprising:

forming a dielectric with an upper surface and having openings extending downwardly from said upper surface;

forming a first metal layer over said dielectric and filling said openings, then polishing to planarize and remove portions of said first metal layer from over said upper surface to produce first metal features in said openings;

determining a thickness of said first metal features;

forming a further dielectric by depositing at least one subsequent dielectric layer to a predetermined aggregate thickness over said dielectric and over said first metal features;

etching portions of said further dielectric to a predetermined depth thereby creating further openings having bottom surfaces in said further dielectric, at least one of said predetermined aggregate thickness and said depth determined based upon said thickness of said first metal features;

forming a second metal layer over said further dielectric and filling said further openings; and further polishing to produce second metal features of said second metal layer.

17. The method as in claim 16, wherein said further polishing comprises at least removing portions of said second metal layer from over said further dielectric to produce said second metal features in said further openings.

18. The method as in claim 17, wherein said further polishing includes receding an upper surface of said further dielectric by an amount determined based upon said thickness of said first metal features, and wherein said at least one of said predetermined aggregate thickness and said depth is determined based upon a difference between said thickness of said first metal features and an original target thickness for said first metal features.

19. The method as in claim 16, wherein said forming a further dielectric and etching portions of said subsequent dielectric compensates for said determined thickness of said first metal features whereby:

if said thickness of said first metal features is greater than a desired thickness of said first metal features, said aggregate thickness, an amount of said etching portions of said further dielectric, and an amount of said further polishing, are controlled to produce said second met features having a thickness less than an original second metal target thickness; and if said thickness of said first metal features is less than a desired thickness of said first metal features, said aggregate thickness, an amount of said etching portions of said further dielectric, and an amount of said further polishing, are controlled to produce said second metal features having a thickness greater than an original second metal target thickness.

20. A method for forming a semiconductor device, said method comprising:

establishing a first metal target thickness for first metal features and an original second metal target thickness for second metal features;

producing a first metal layer with said first metal features having an actual first metal thickness;

establishing an adjusted second metal target thickness, said adjusted second metal target thickness differing from said original second metal target thickness by a difference between said actual first metal thickness and said first metal target thickness;

forming a dielectric over said first metal features, said dielectric having a dielectric thickness;

etching portions of said dielectric to a depth thereby creating openings having bottom surfaces in said dielectric;

forming a second metal layer over said dielectric and filling said openings;

polishing to at least remove portions of said second metal layer from over said dielectric and producing said second metal features in said openings; and controlling processing parameters for said forming a dielectric, said etching portions, and polishing to produce a target dielectric thickness, a target depth and a target amount of polishing that combine to produce said second metal features having said adjusted second metal target thickness.

* * * * *

UNITED STATES PATENT AND TRADEMARK OFFICE
CERTIFICATE OF CORRECTION

| | | |
|---|---|---|
| PATENT NO. | : 9,165,880 B2 | Page 1 of 1 |
| APPLICATION NO. | : 13/420194 | |
| DATED | : October 20, 2015 | |
| INVENTOR(S) | : Po-Jen Wang et al. | |

It is certified that error appears in the above-identified patent and that said Letters Patent is hereby corrected as shown below:

IN THE CLAIMS:

Claim 19, Column 10, Line 24, delete "met" and insert -- metal --

Signed and Sealed this
Twenty-first Day of June, 2016

Michelle K. Lee
*Director of the United States Patent and Trademark Office*